United States Patent
Iga

[19]

[11] Patent Number: 6,014,058

[45] Date of Patent: Jan. 11, 2000

[54] HIGH-SPEED AGC CIRCUIT

[75] Inventor: Hisataka Iga, Tokyo, Japan

[73] Assignee: NEC Corporation, Tokyo, Japan

[21] Appl. No.: 09/141,270

[22] Filed: Aug. 27, 1998

[30] Foreign Application Priority Data

Sep. 2, 1997 [JP] Japan ................................ 9-237010

[51] Int. Cl.[7] ................................................. H03G 3/30
[52] U.S. Cl. ............................ 330/279; 330/136; 330/140
[58] Field of Search .................................... 330/129, 136, 330/140, 141, 279, 281

[56] References Cited

U.S. PATENT DOCUMENTS

| | | | |
|---|---|---|---|
| 5,745,847 | 4/1998 | Matsuo | 330/279 X |
| 5,784,689 | 7/1998 | Kobayashi | 330/279 X |
| 5,903,193 | 5/1999 | Adachi | 330/279 |

FOREIGN PATENT DOCUMENTS

| | | |
|---|---|---|
| 57-201312 | 12/1982 | Japan . |
| 60-22815 | 2/1985 | Japan . |
| 60-22816 | 2/1985 | Japan . |
| 60-227577 | 11/1985 | Japan . |
| 3-198517 | 8/1991 | Japan . |
| 4-163703 | 6/1992 | Japan . |
| 5-14089 | 1/1993 | Japan . |
| 5-83053 | 4/1993 | Japan . |
| 7-50534 | 2/1995 | Japan . |
| 8-316754 | 11/1996 | Japan . |

*Primary Examiner*—Steven J. Mottola
*Attorney, Agent, or Firm*—Scully, Scott, Murphy & Presser

[57] ABSTRACT

An AGC circuit includes an amplifier, a first detector, a pulse generator, a second detector, a switching circuit, and a gain controller. The amplification factor of the amplifier for an input signal is controlled by a gain control voltage. The first detector detects the output level of the amplifier. The pulse generator generates a variable-width pulse signal on the basis of an output from the first detector. The second detector detects the presence/absence of an input signal. The switching circuit switches between an output from the pulse generator and an output from the first detector and outputs the switched output in accordance with a detection output from the second detector. The gain controller outputs the gain control voltage to the amplifier on the basis of an output from the switching circuit. Upon switching an input signal and turning on the power supply, the pulse generator outputs a pulse signal having a predetermined pulse width to the switching circuit to temporarily set the gain control voltage of the amplifier near the operating point.

9 Claims, 3 Drawing Sheets

HIGH-SPEED AGC CIRCUIT

BACKGROUND OF THE INVENTION

The present invention relates to an automatic gain control (AGC) circuit and, more particularly, to an AGC circuit which shortens the pull-in time upon switching an input signal or turning on the power supply.

Generally in an AGC circuit, as the loop band ldecreases, the pull-in time becomes longer upon switching an input signal or turning on the power supply. For this reason, the pull-in time is desired to be shortened.

FIG. 3 shows an AGC circuit using a conventional method of shortening the pull-in time upon switching an input signal, which is disclosed in Japanese Patent Laid-Open No. 5-83053. In the AGC circuit shown in FIG. 3, a peak hold circuit 32 detects the peak voltage of an output from an amplifier 31 to output a peak hold voltage Vp. An operational amplifier 33 arithmetically processes and amplifies the peak hold voltage Vp from the peak hold circuit 32 and a reference voltage Vr to output a gain control voltage Vc. An analog-to-digital (A/D) converter 35 converts the gain control voltage Vc into a digital signal and stores the digital signal in a memory 36 in accordance with a write enable signal WE and an address signal ADR.

The digital signal stored in the memory 36 is converted into an analog voltage (gain control voltage Vm) by a digital-to-analog (D/A) converter 37. A system switching circuit 38 selects one of an output from the D/A converter 37 and an output from the operational amplifier 33 in accordance with an external selection signal SEL, and outputs the selected one to a gain switching circuit 34. The gain switching circuit 34 controls the amplification factor of the amplifier 31 on the basis of an output from the system switching circuit 38.

In the AGC circuit having this arrangement, a digital signal for the gain control voltage Vc corresponding to an input signal is stored in the memory 36 in accordance with addresses corresponding to input signals having various fixed amplitudes. When the input signal is switched, the system switching circuit 38 is switched, and then the amplification factor of the amplifier 31 is controlled on the basis of the digital signal for the gain control voltage Vc corresponding to the input signal that is read out from the memory 36.

The conventional AGC circuit uses the A/D converter 35, the memory 36, and the D/A converter 37 to increase the number of components, which does not allow cost reduction. In addition, noise upon switching the gain switching circuit 34 may be applied to the amplifier 31. Upon turning on the power supply, the above AGC circuit requires a long pull-in time, like a general AGC circuit.

SUMMARY OF THE INVENTION

It is an object of the present invention to provide an AGC circuit capable of shortening the pull-in time with a simple arrangement.

In order to achieve the above object, according to the present invention, there is provided an AGC circuit comprising amplification means whose amplification factor for an input signal is controlled by a gain control voltage, first detection means for detecting an output level of the amplification means, pulse generation means for generating a variable-width pulse signal on the basis of an output from the first detection means, second detection means for detecting presence/absence of an input signal, switching means for switching between an output from the pulse generation means and an output from the first detection means and outputting the switched output in accordance with a detection output from the second detection means, and gain control means for outputting the gain control voltage to the amplification means on the basis of an output from the switching means, wherein upon switching an input signal and turning on a power supply, the pulse generation means outputs a pulse signal having a predetermined pulse width to the switching means to temporarily set the gain control voltage of the amplification means near an operating point.

DESCRIPTION OF THE PREFERRED EMBODIMENT

The present invention will be described in detail below with reference to the accompanying drawings.

Figure 1:
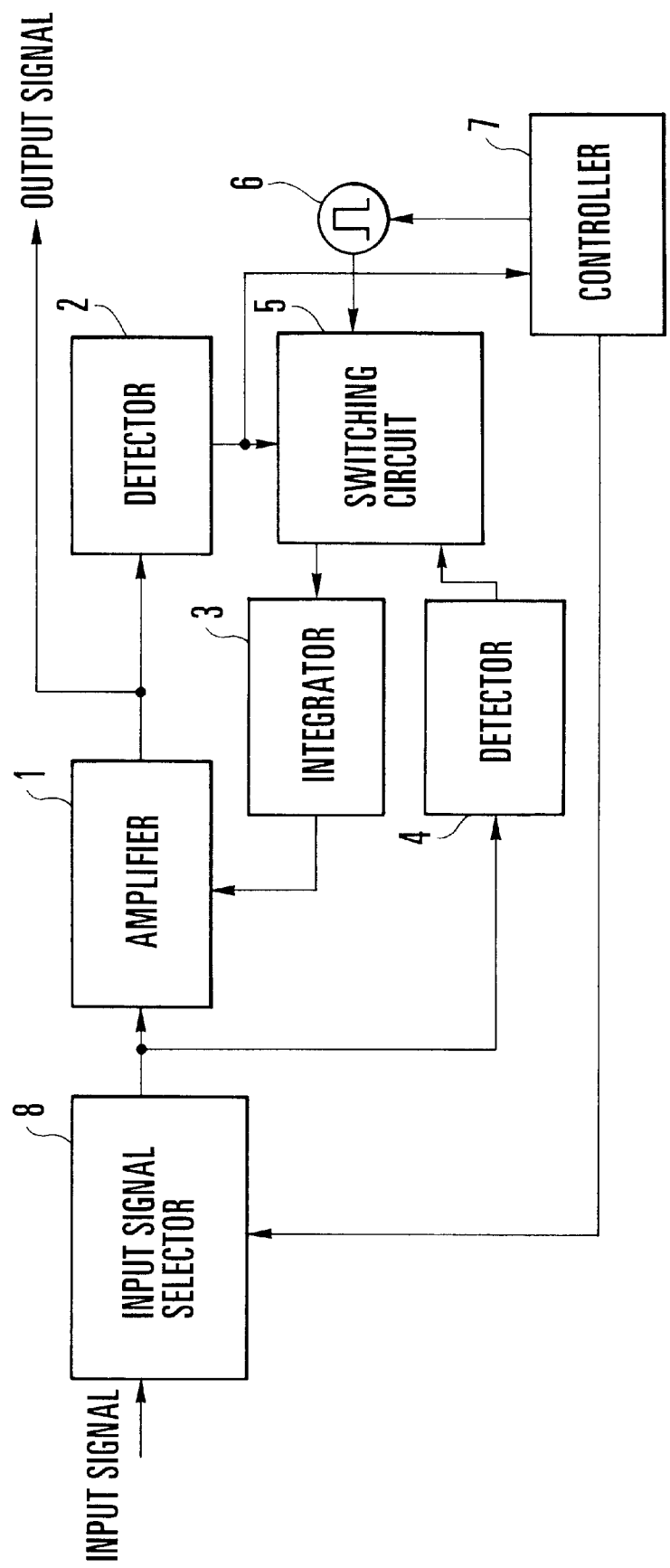
FIG. 1 is a block diagram showing an AGC circuit according to an embodiment of the present invention.

FIG. 1 shows an AGC circuit according to an embodiment of the present invention. In FIG. 1, the AGC circuit of this embodiment comprises a variable gain amplifier 1 for amplifying an input signal with the amplification factor based on the gain control voltage, a first detector 2 for detecting the output level of the amplifier 1, an integrator 3 for outputting the gain control voltage to the amplifier 1, a second detector 4 for detecting the state (presence/absence) of the input signal, a switching circuit 5, a variable-width pulse generator 6 for generating a variable-width pulse signal, a controller 7, and an input signal selector 8 for selecting one of input signals each having a fixed amplitude.

The integrator 3 integrates and smooths an output from the switching circuit 5, and outputs the smoothed signal as a gain control signal to the amplifier 1. The detector 4 detects the level of an input signal output from the selector 8 and outputs a detection signal representing the presence/absence of the input signal to the switching circuit 5. The switching circuit 5 is switched in accordance with the output from the detector 4 to select one of an output from the detector 2 and an output from the variable-width pulse generator 6 and output the selected one to the integrator 3. The controller 7 controls input signal selection of the selector 8 and pulse signal generation of the pulse generator 6.

In the AGC circuit having this arrangement, the selector 8 selects a target input signal and outputs it to the amplifier 1 in accordance with a control signal from the controller 7. The first detector 2 detects the output level of the output signal from the amplifier 1 and outputs the level as a gain control voltage to the switching circuit 5 and the controller 7.

The controller 7 controls the width of a pulse signal generated by the pulse generator 6 on the basis of the output from the detector 2, and also controls the selector 8. The pulse output from the pulse generator 6 is output to the switching circuit 5. The switching circuit 5 selects one of the output from the detector 2 and the output from the pulse generator 6 in accordance with an output from the detector 4, and outputs the selected one to the integrator 3. The integrator 3 integrates the output from the switching circuit 5 to output a gain control voltage to the amplifier 1.

When an input signal is selected by the selector 8, the detector 2 detects an output from the amplifier 1 and inputs it to the switching circuit 5. The switching circuit 5 selects the output from the detector 2 and outputs it to the integrator 3 in accordance with an output from the detector 4. The integrator 3 outputs a gain control voltage prepared by smoothing the selected output from the switching circuit 5, i.e., the output from the detector 2, and controls the gain of the amplifier 1. That is, during selection of an input signal, AGC characteristics which follow a slight level change in input signal can be obtained.

The operation when the input signal selected by the selector 8 is switched under the control of the controller 7 will be exemplified. The detector 4 detects that no input signal is output from the selector 8. The switching circuit 5 switches the output from the detector 2 to the output from the pulse generator 6, and outputs the switched one to the integrator 3 in accordance with the detection output from the detector 4. In this case, the controller 7 maintains the output level of the detector 2 before switching and controls the pulse generator 6, thereby controlling the pulse output from the pulse generator 6 to the pulse width before switching. Accordingly, upon switching the input signal, the gain control voltage output from the integrator 3 to the amplifier 1 is fixed near the operating point before switching.

When the detector 4 detects the input signal selected by the selector 8, it outputs a detection signal to the switching circuit 5. The switching circuit 5 switches the output from the pulse generator 6 to the output from the detector 2 in accordance with the detection output from the detector 4, and outputs the switched one. The integrator 3 integrates the output from the switching circuit 5, i.e., the output from the detector 2 and outputs a gain control signal to the amplifier 1. Therefore, immediately after selecting an input signal, the AGC circuit operates to shorten the pull-in time.

Upon turning on the power supply, the controller 7 controls the pulse output from the pulse generator 6 at an initial state. The switching circuit 5 selects the output from the pulse generator 6 and outputs it to the integrator 3 in accordance with a detection output from the detector 4. The integrator 3 fixes the gain control voltage of the amplifier 1 near the operating point on the basis of the output from the switching circuit 5, i.e., the pulse output from the pulse generator 6. If the detector 4 detects a selected input signal, the switching circuit 5 is switched to select the output from the detector 2 and shorten the pull-in time.

Figure 2:
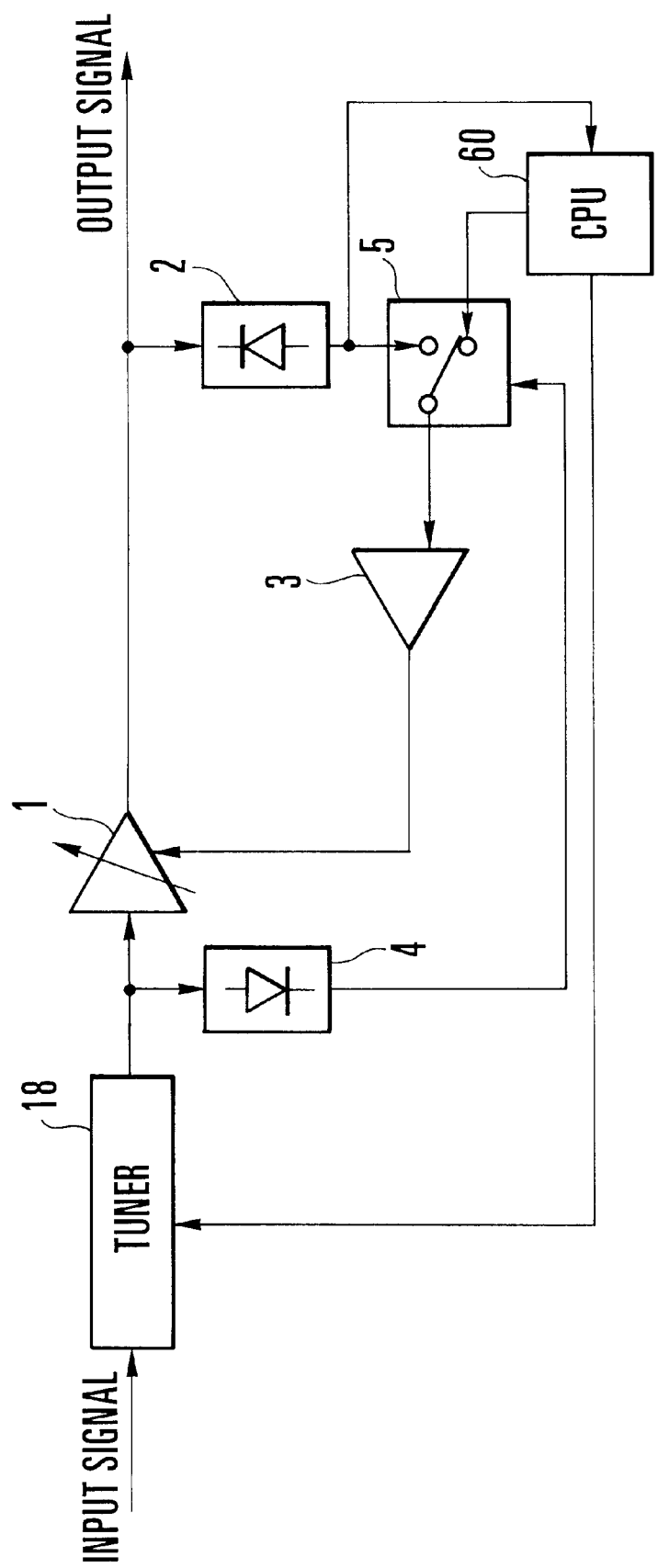
FIG. 2 is a circuit diagram showing a detailed example of the AGC circuit shown in FIG. 1.
Figure 3:
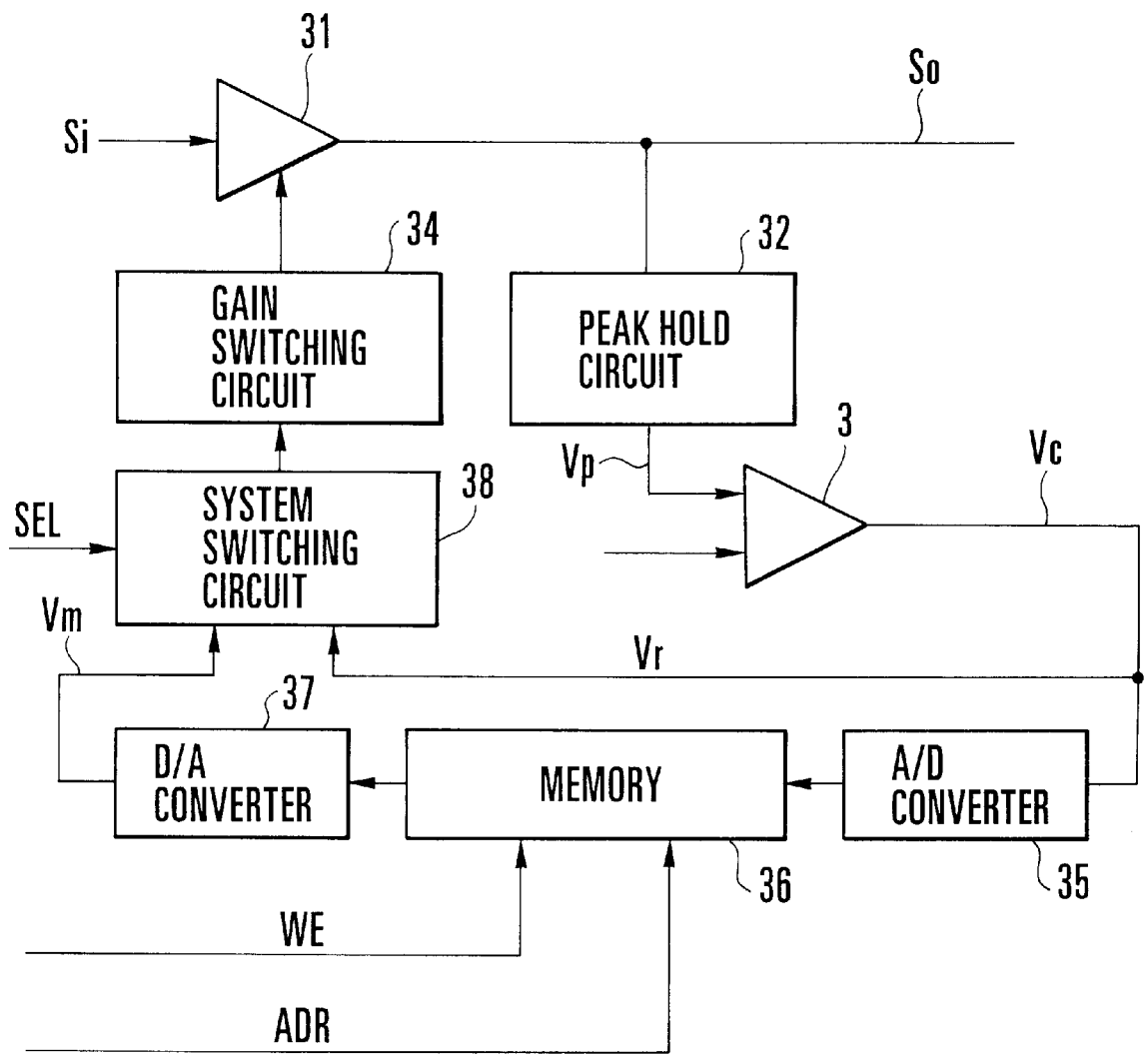
FIG. 3 is a block diagram showing an example of a conventional AGC circuit.

FIG. 2 shows a detailed example of the AGC circuit shown in FIG. 1.

In FIG. 2, reference numeral 18 denotes a tuner which selects the frequency of an input signal and constitutes the input signal selector 8 shown in FIG. 1; and 60, a CPU (Central Processing Unit) which outputs, to the switching circuit 5, a pulse signal having a width based on an output from the detector 2, and constitutes the pulse generator 6 and the controller 7 in FIG. 1. The CPU 60 controls the tuner 18 to select an input signal.

In this arrangement, the tuner 18 selects the frequency of an input signal in accordance with a selection control signal from the CPU 60. The detector 4 detects an output from the tuner 18 and inputs it to the integrator 3 via the switching circuit 5. At this time, the switching circuit 5 selects and outputs the output from the detector 2 in accordance with the output from the detector 4. The integrator 3 outputs, to the amplifier 1, a gain control voltage prepared by integrating the output from the switching circuit 5, i.e., the output from the detector 2. The amplification factor of the amplifier 1 is controlled by the gain control voltage from the integrator 3 to perform normal AGC operation.

When the CPU 60 controls the tuner 18 to switch the input signal, the detector 4 detects the absence of an output from the tuner 18. The switching circuit 5 switches the output from the detector 2 to the output pulse from the CPU 60, and outputs the switched one in accordance with an output from the detector 4. At this time, the CPU 60 outputs a pulse having a width in accordance with the output from the detector 2 before switching. Then, the integrator 3 controls the amplification factor of the amplifier 1 at a gain control voltage near the operating point of the input signal before switching.

When the tuner 18 outputs the selected input signal, the detector 4 detects the input signal and outputs a detection signal to the switching circuit 5. The switching circuit 5 switches the pulse output from the CPU 60 to the output from the detector 2 in accordance with the output from the detector 4, and outputs the switched one to the integrator 3. Therefore, the AGC circuit operates immediately.

Upon turning on the power supply, the CPU 60 outputs a pulse whose width is set at an initial value. At this time, since the detector 4 does not detect any input signal, the switching circuit 5 selects the output pulse from the CPU 60 and outputs it to the integrator 3. The integrator 3 smooths the output pulse from the CPU 60 and fixes the gain control voltage of the amplifier 1 near the operating point. When an input signal is input via the tuner 18, the detector 4 detects the input signal to operate the switching circuit 5. The switching circuit 5 switches the pulse output from the CPU 60 to the output from the detector 2, and outputs the switched one to the integrator 3, thereby shortening the pull-in time.

As has been described above, according to the AGC circuit of the present invention, the pull-in time can be greatly shortened because the operating point of the gain control voltage is maintained using a variable-width pulse output upon switching an input signal or turning on the power supply. With a simple arrangement, the AGC circuit can stably operate.

What is claimed is:

1. An AGC circuit comprising:

amplification means whose amplification factor for an input signal is controlled by a gain control voltage;

first detection means for detecting an output level of said amplification means;

pulse generation means for generating a variable-width pulse signal on the basis of an output from said first detection means;

second detection means for detecting presence/absence of an input signal;

switching means for switching between an output from said pulse generation means and an output from said first detection means and outputting the switched output in accordance with a detection output from said second detection means; and gain control means for outputting the gain control voltage to said amplification means on the basis of an output from said switching means, wherein upon switching an input signal and turning on a power supply, said pulse generation means outputs a pulse signal having a predetermined pulse width to said switching means to temporarily set the gain control voltage of said amplification means near an operating point.

2. A circuit according to claim 1, further comprising control means for controlling said pulse generation means and outputting a pulse signal having a pulse width before switching to said switching means upon switching an input signal.

3. A circuit according to claim 1, further comprising control means for controlling said pulse generation means and outputting a pulse signal having a pulse width set at an initial value to said switching means upon turning on a power supply.

4. A circuit according to claim 1, further comprising signal selection means for selecting one of a plurality of input signals having different amplitudes and outputting the selected signal to said amplification means.

5. A circuit according to claim 4, wherein said signal selection means comprises a tuner for selecting a frequency of an input signal in accordance with a selection control signal.

6. A circuit according to claim 1, wherein said gain control means comprises integration means for integrating and smoothing an output from said switching means and outputting the gain control voltage of said amplification means.

7. A circuit according to claim 1, wherein said second detection means controls switching of said switching means on the basis of a detection result of an input signal to said amplification means.

8. An AGC circuit comprising:
   a tuner for selecting a frequency of an input signal in accordance with a selection control signal;
   a variable gain amplifier whose amplification factor for the input signal output from said tuner is controlled by a gain control voltage;
   a first detector for detecting an output level of said variable gain amplifier;
   a pulse generator for generating a variable-width pulse signal on the basis of an output from said first detector;
   a second detector for detecting presence/absence of an input signal output from said tuner;
   a switching circuit for switching between an output from said pulse generator and an output from said first detector and outputting the switched output in accordance with a detection output from said second detector;
   an integrator for integrating an output from said switching circuit and outputting the gain control voltage to said variable gain amplifier; and
   a controller for outputting the selection control signal to said tuner, and upon switching an input signal and turning on a power supply, outputting pulse signals respectively having a pulse width before switching and a pulse width set at an initial value to said switching circuit, thereby temporarily setting the gain control voltage of said amplifier near an operating point.

9. A circuit according to claim 8, wherein said controller and said pulse generator are constituted by a central processing unit (CPU).

* * * * *